(12) United States Patent
Pai et al.

(10) Patent No.: US 11,307,716 B2
(45) Date of Patent: Apr. 19, 2022

(54) CAPACITIVE TOUCH GLASS STRUCTURE

(71) Applicants: Chih-Chiang Pai, Taoyuan (TW);
 Meng-Kuei Lin, Taoyuan (TW);
 Hung-Chi Huang, Taoyuan (TW);
 Chiu-Wen Chen, Taoyuan (TW)

(72) Inventors: Chih-Chiang Pai, Taoyuan (TW);
 Meng-Kuei Lin, Taoyuan (TW);
 Hung-Chi Huang, Taoyuan (TW);
 Chiu-Wen Chen, Taoyuan (TW)

(73) Assignee: YOUNG FAST OPTOELECTRONICS CO., LTD., Taoyuan (TW)

( * ) Notice: Subject to any disclaimer, the term of this patent is extended or adjusted under 35 U.S.C. 154(b) by 488 days.

(21) Appl. No.: 16/362,761

(22) Filed: Mar. 25, 2019

(65) Prior Publication Data

US 2020/0310568 A1 Oct. 1, 2020

(51) Int. Cl.
 *G06F 3/044* (2006.01)
 *H05K 1/03* (2006.01)
 *G06F 3/041* (2006.01)

(52) U.S. Cl.
 CPC ............ *G06F 3/044* (2013.01); *G06F 3/0412* (2013.01); *H05K 1/0306* (2013.01); *H05K 2201/0326* (2013.01)

(58) Field of Classification Search
 CPC ..... G06F 3/044; G06F 3/0412; H05K 1/0306; H05K 2201/0326
 See application file for complete search history.

(56) References Cited

U.S. PATENT DOCUMENTS

| | | | | |
|---|---|---|---|---|
| 2017/0099741 A1* | 4/2017 | Shin | ......................... | G06F 3/041 |
| 2020/0075895 A1* | 3/2020 | Oh | ......................... | G06F 3/0412 |
| 2020/0142525 A1* | 5/2020 | Han | ....................... | G06F 1/1626 |
| 2020/0218399 A1* | 7/2020 | Maeng | ................... | G06F 3/0412 |

* cited by examiner

*Primary Examiner* — Peter D McLoone

(57) ABSTRACT

A glass structure includes a glass substrate, a first sensing layer, a second sensing layer, a signal wire layer and an insulative layer. Each of the two sensing layers is formed by a metal oxide conductive film electrically connected onto a metal mesh and has sensing columns and isolation columns which insulatively separate the sensing columns. An end of each of the sensing columns is provided with a contact connected to the signal wire layer. Conductive material of each isolation column is divided into disconnected insulative areas. The insulative layer is adhesively disposed between the first and second sensing layers. The sensing columns of the first sensing layers are orthogonal to the second sensing columns on the second sensing layer to constitute a capacitive sensing unit array.

7 Claims, 10 Drawing Sheets

CAPACITIVE TOUCH GLASS STRUCTURE

TECHNICAL FIELD

The invention relates to transparent touch sensors, particularly to capacitive touch glass structures.

Related Art

Capacitive electrodes of conventional transparent capacitive touch glass are usually made by etching an indium tin oxide (ITO) film. Capacitive sensing electrodes and signal paths are formed on the ITO conductive film to constitute a touch sensing circuit pattern, so there are an electrode portion formed by the conductive material and a scraped portion formed by removing conductive material. The electrode portion and the scraped portion have different transmittance to cause unevenness of refraction of light penetrating through the ITO film. This will result in obvious pattern or grain when a user is viewing the display. Particularly, when the touch sensor is mounted on a display, deformation, vague or distortion of images will occur.

Besides, with more and more precision development of electronic products, touch sensing electrodes and signal paths of a touch sensor become narrower and narrower in size. However, narrowed electrodes and signal paths will increase impedance to attenuate signals. Especially for the applications of large-sized touch panels, conductivity of ITO films has been hard to satisfy requirements.

SUMMARY OF THE INVENTION

An object of the invention is to provide a capacitive touch glass structure, which possesses high uniform transmittance to be capable of being mounted in front of a display with improving interference and keeping visibility of an image shown on the display.

Another object of the invention is to provide a capacitive touch glass structure, which can improve conductive efficiency of touch signals to be advantageous to design and application of large-sized touch panels.

To accomplish the above objects, the invention provides a capacitive touch glass structure, which includes:

a glass substrate, having a colored bezel on a periphery of a side thereof, and the colored bezel defining a shaded area and a visible area surrounded by the shaded area;

a first sensing layer, formed by a metal oxide conductive film electrically connected onto a metal mesh, disposed on the glass substrate, having first sensing columns along a first direction in the visible area, a first isolation column being sandwiched between every adjacent two of the first sensing columns to separate and insulate the first sensing columns, conductive material of each first isolation column being divided into disconnected insulative areas, an end of each of the first sensing columns being provided with a first contact, and the first contacts being outward extended from the metal oxide conductive film to the shaded area;

a second sensing layer, formed by a metal oxide conductive film electrically connected onto a metal mesh, having second sensing columns along a second direction in the visible area, a second isolation column being sandwiched between every adjacent two of the second sensing columns to separate and insulate the second sensing columns, conductive material of each second isolation column being divided into disconnected insulative areas, an end of each of the second sensing columns being provided with a second contact, and the second contacts being outward extended from the metal oxide conductive film to the shaded area;

a signal wire layer, disposed within the shaded area, having first signal transmission wires and second signal transmission wires, each of the first signal transmission wires being electrically connected to one of the first contacts, an end of each of the first signal transmission wires being electrically connected to a first signal output contact, each of the second signal transmission wires being electrically connected to one of the second contacts, and an end of each of the second signal transmission wires being electrically connected to a second signal output contact; and an insulative layer disposed between the first sensing layer and the second sensing layer;

wherein the first direction is orthogonal to the second direction, the first sensing columns are orthogonal to the second sensing columns to constitute a capacitive sensing unit array.

Preferably, the glass substrate may adopt glass material with high transmittance, such as sodium calcium silicate glass, sodium borosilicate glass, lead crystal glass, aluminum silicate glass or low iron glass, but not limited to these. The colored bezel is formed by an insulative film layer made of ink or photoresist, but not limited to these.

Preferably, the metal oxide conductive film is made of indium tin oxide (ITO), indium zinc oxide (IZO), aluminum zinc oxide (AZO), antimony tin oxide (ATO) or poly(3,4-ethylenedioxythiophene (PEDOT), but not limited to these.

Preferably, the metal mesh is woven by metal wires made of gold, silver, copper, aluminum, molybdenum, nickel or an alloy thereof, but not limited to these.

Preferably, the signal wire layer is made of gold, silver, copper, aluminum, molybdenum, nickel or an alloy thereof or conductive silver paste, but not limited to these.

Preferably, the insulative layer is made of solid optically clear adhesive (OCA) or liquid optical clear resin (OCR), but not limited to these.

Preferably, each of the insulative areas is a hexagon, triangle, rectangle, trapezoid, strip, polygon or circle in shape, but not limited to these.

DETAILED DESCRIPTION OF THE INVENTION

Figure 1:
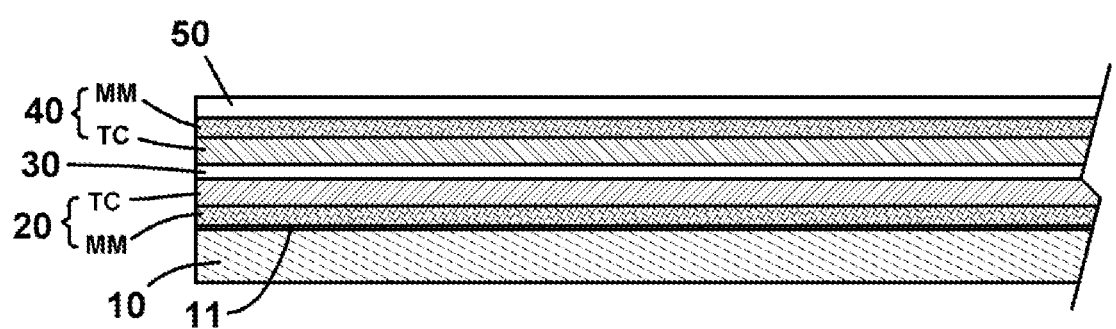
FIG. 1 is a cross-sectional view of a laminated structure of the invention.
Figure 2:
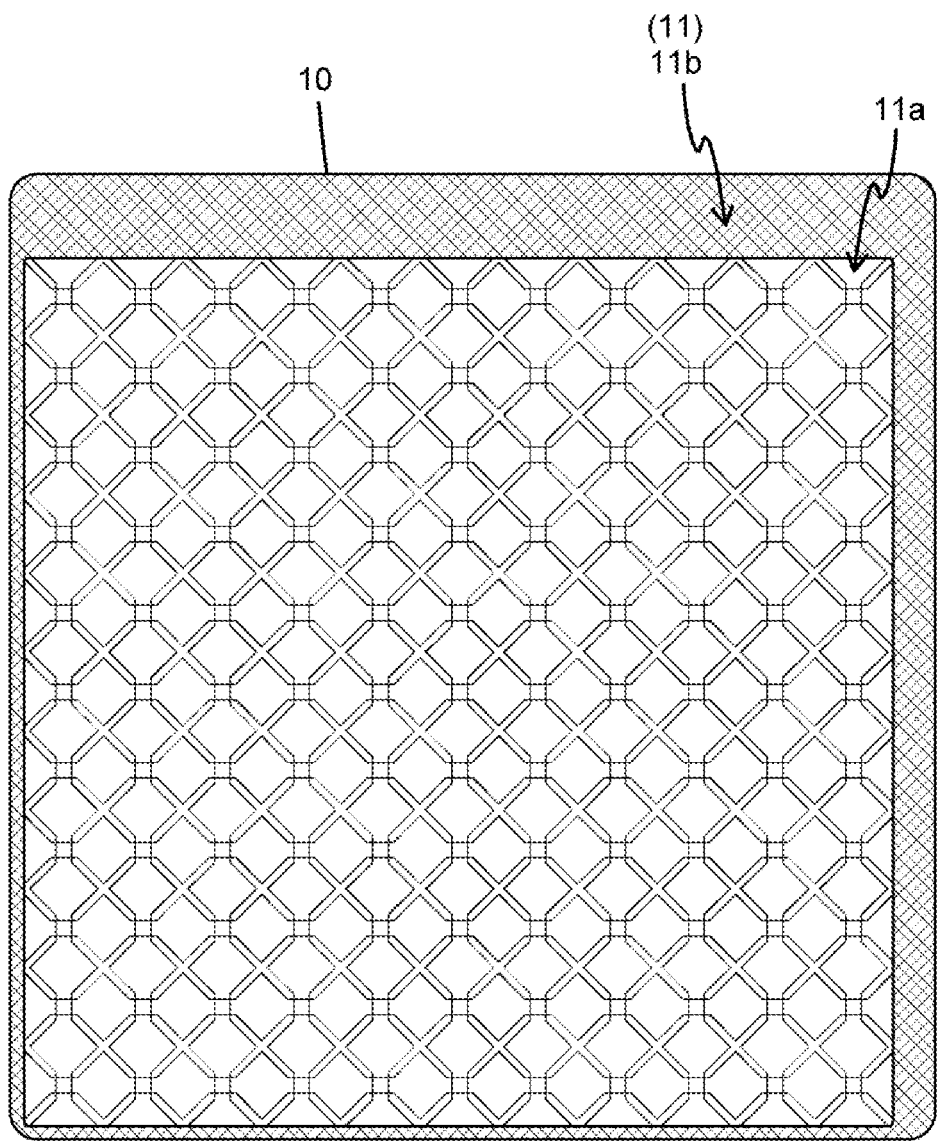
FIG. 2 is a top plan view of the invention.
Figure 3:
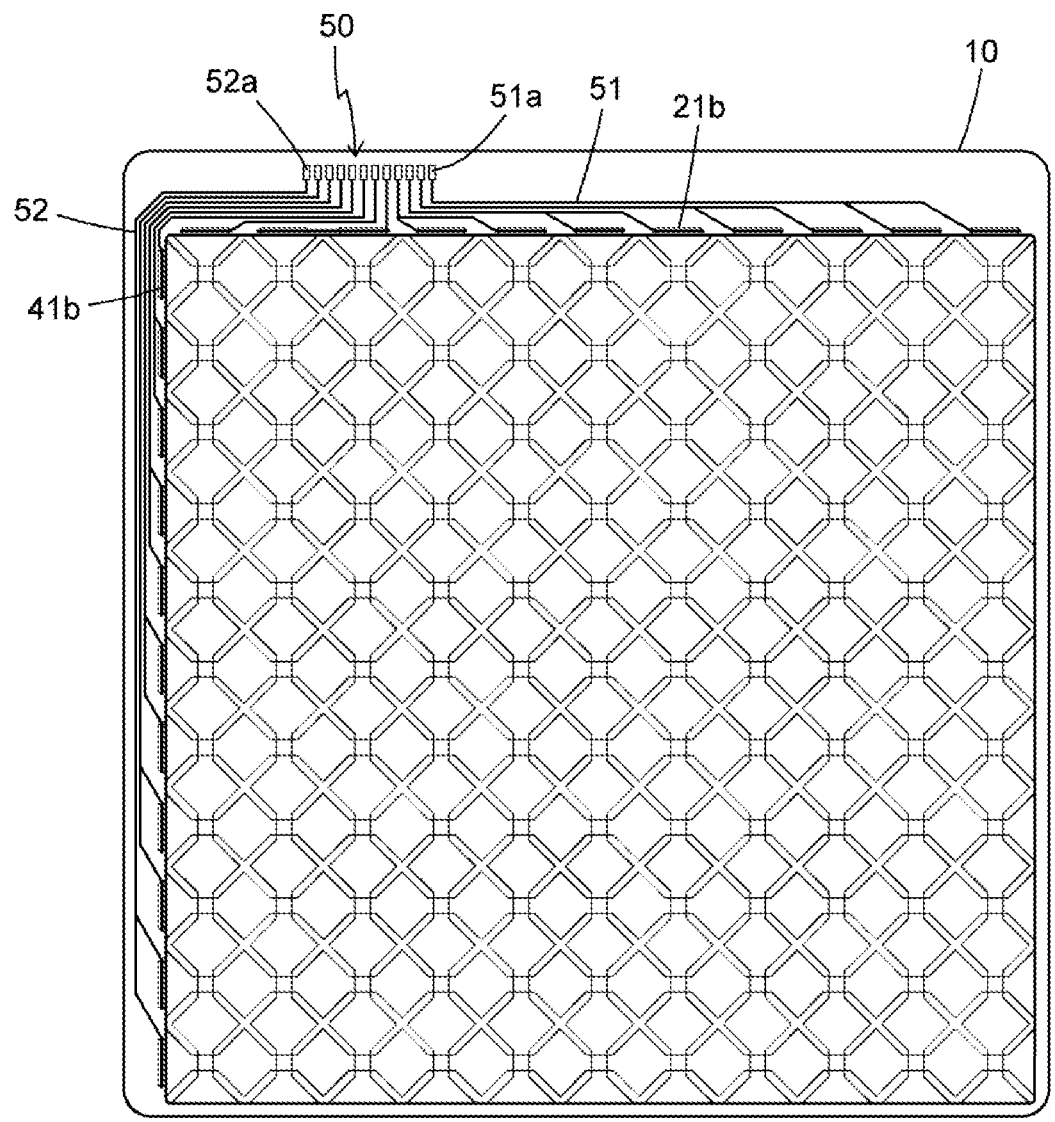
FIG. 3 is a back plan view of the invention.
Figure 4:
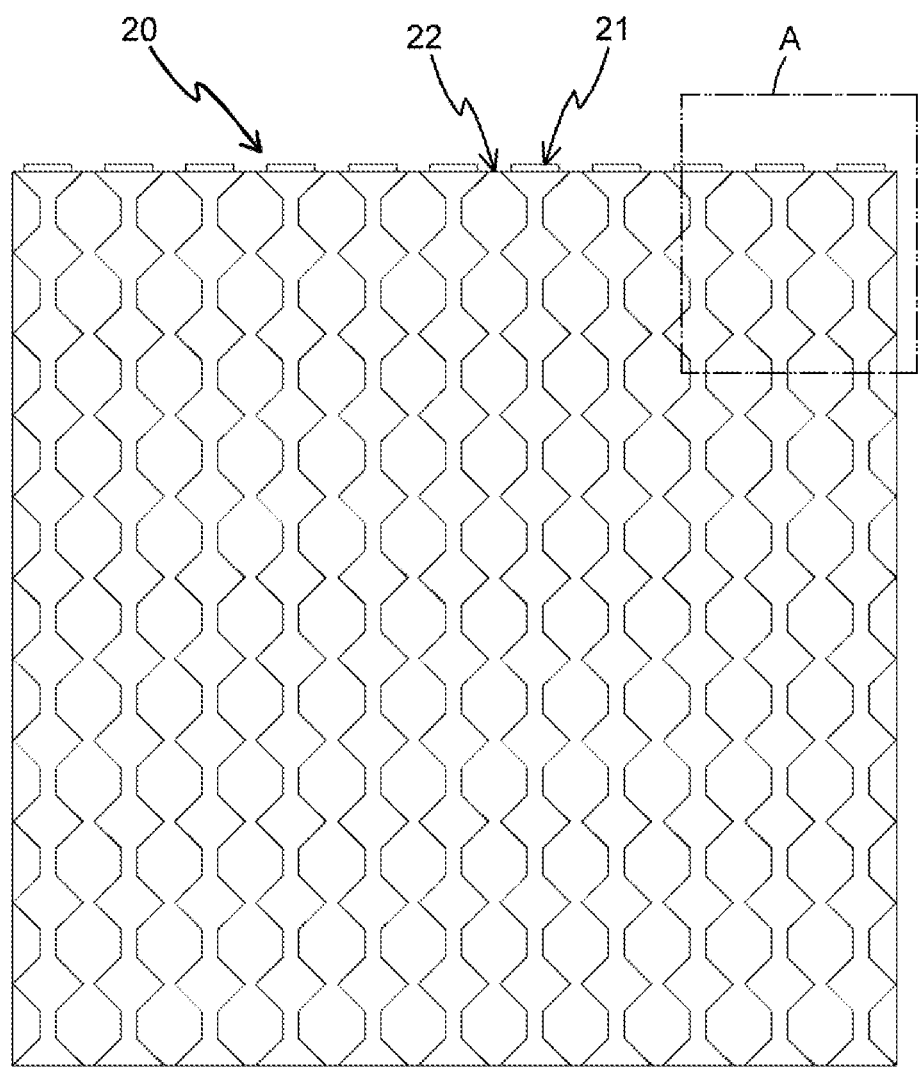
FIG. 4 is a plan view of the first sensing layer of the invention.

As shown in FIGS. 1-3, a preferred embodiment of the capacitive touch glass structure of the invention includes a glass substrate 10, a first sensing layer 20, an insulative layer 30, a second sensing layer 40 and a signal wire layer 50 in the order named. The glass substrate 10 is a glass thin plate with great mechanic strength and high transmittance, such as sodium calcium silicate glass with the refraction index (RI) of about 1.5. A periphery of a side of the glass substrate 10 has a colored bezel 11 which is a film layer formed an insulative material. The insulative material may be ink or photoresist, which is coated on the glass substrate 10 by, but not limited to, printing or painting. The colored bezel 11 defines a shaded area 11b and a visible area 11a surrounded by the shaded area 11b on the glass substrate 10.

Figure 5:
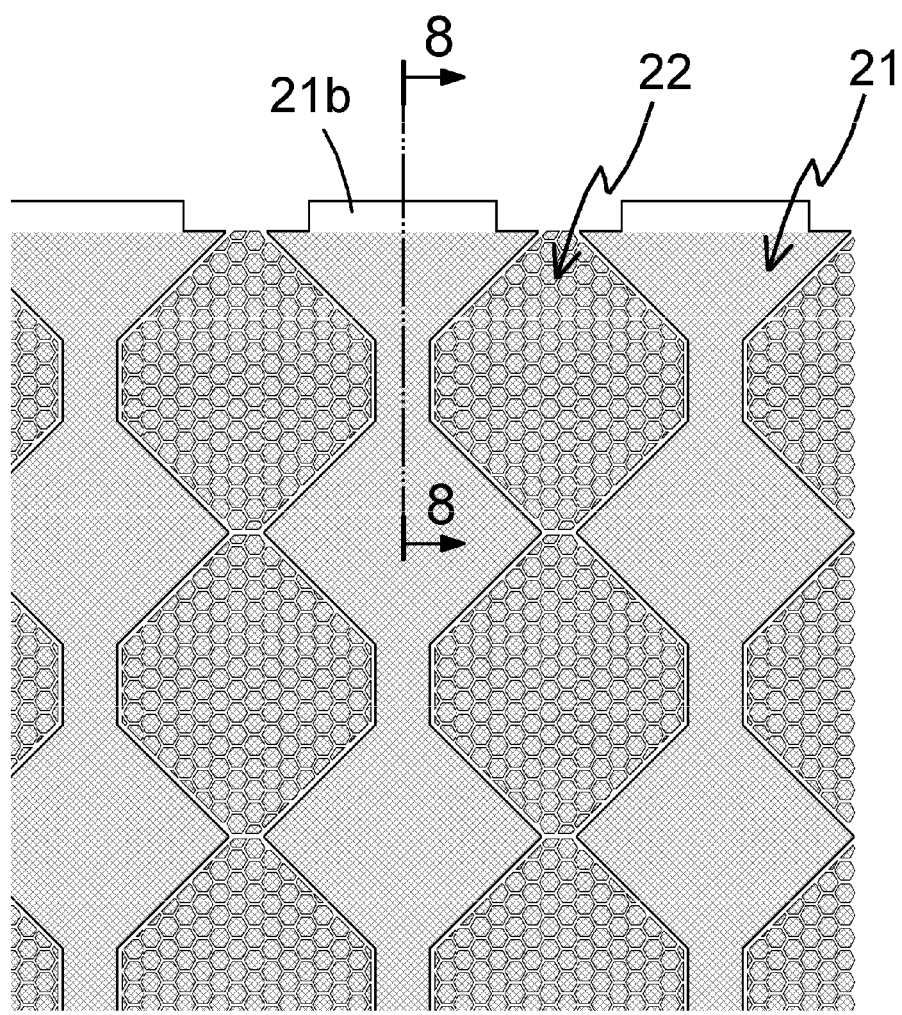
FIG. 5 is an enlarged view of part A in FIG. 4.
Figure 6:
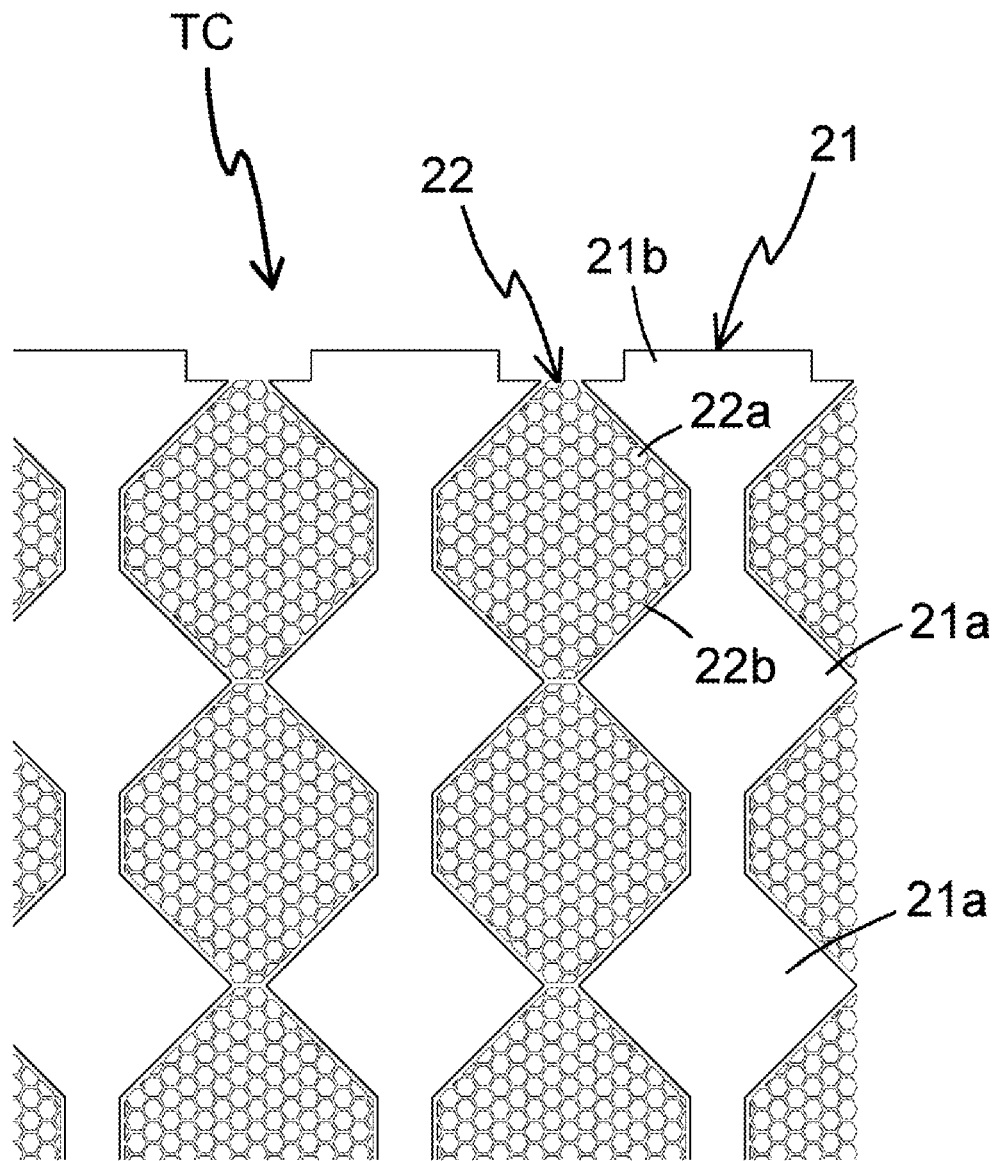
FIG. 6 is an enlarged view of part A in FIG. 4, which shows a plan view of the metal oxide conductive film of the first sensing layer.
Figure 7:
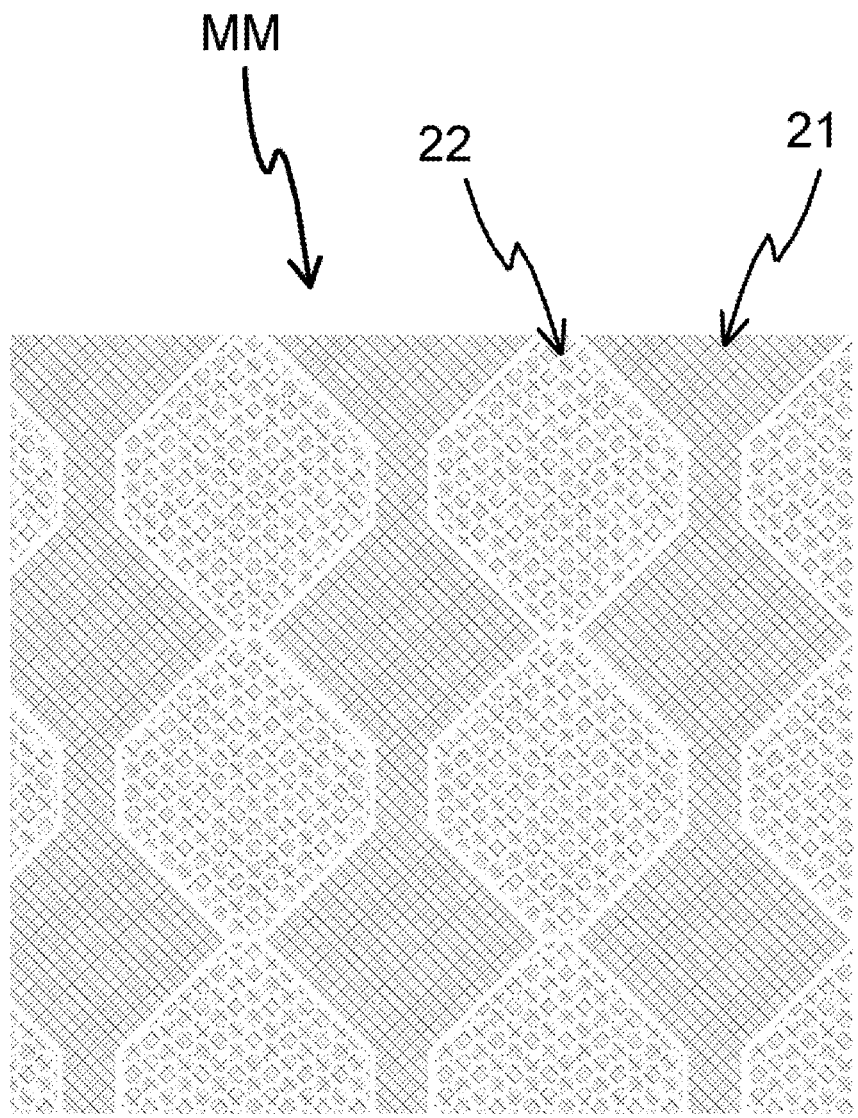
FIG. 7 is an enlarged view of part A in FIG. 4, which shows a plan view of the metal mesh of the first sensing layer.
Figure 8:
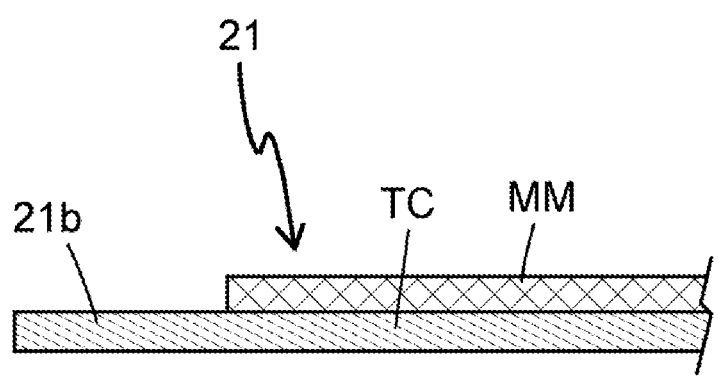
FIG. 8 is a cross-sectional view along line 8-8 in FIG. 5.

As shown in FIGS. 4-8, the first sensing layer 20 is formed by a metal oxide conductive film TC electrically connected onto a metal mesh MM. The metal oxide conductive film TC is made of a conductive material with high transmittance, such as indium tin oxide (ITO). The metal mesh MM is composed of woven tiny metal wires such as nanometer silver or copper wires. Such metal wires are woven to form a mesh sheet with high transmittance of hollowing rate of above 95% and high conductivity. The first sensing layer 20 is disposed on the glass substrate 10 within the visible area 11a and has Y-axis sensing columns 21 and Y-axis isolation columns 22. Each Y-axis isolation column 22 is sandwiched between every adjacent two of the Y-axis sensing columns 21 to separate and insulate the Y-axis sensing columns 21. Each Y-axis sensing column 21 is composed of a string of diamond-shaped Y-axis capacitive sensing units 21a connected in a column along Y-axis. As shown in FIGS. 5 and 8, an upper end of each of the Y-axis sensing columns 21 is provided with a first contact 21b. The first contacts 21b upward extend from the metal oxide conductive film TC of the first sensing layer 20 into the shaded area 11b of the glass substrate 10. Conductive material of each Y-axis isolation column 22 is divided into disconnected insulative areas 22a, between adjacent two of which a gap 22b is arranged, to form insulation. A width of the gap 22b is below 50 µm and a depth thereof is large enough to totally cut off the conductive material. Shapes of the insulative areas 22a are arbitrary, for example, hexagon or any one or more of other geometric shapes.

Figure 9:
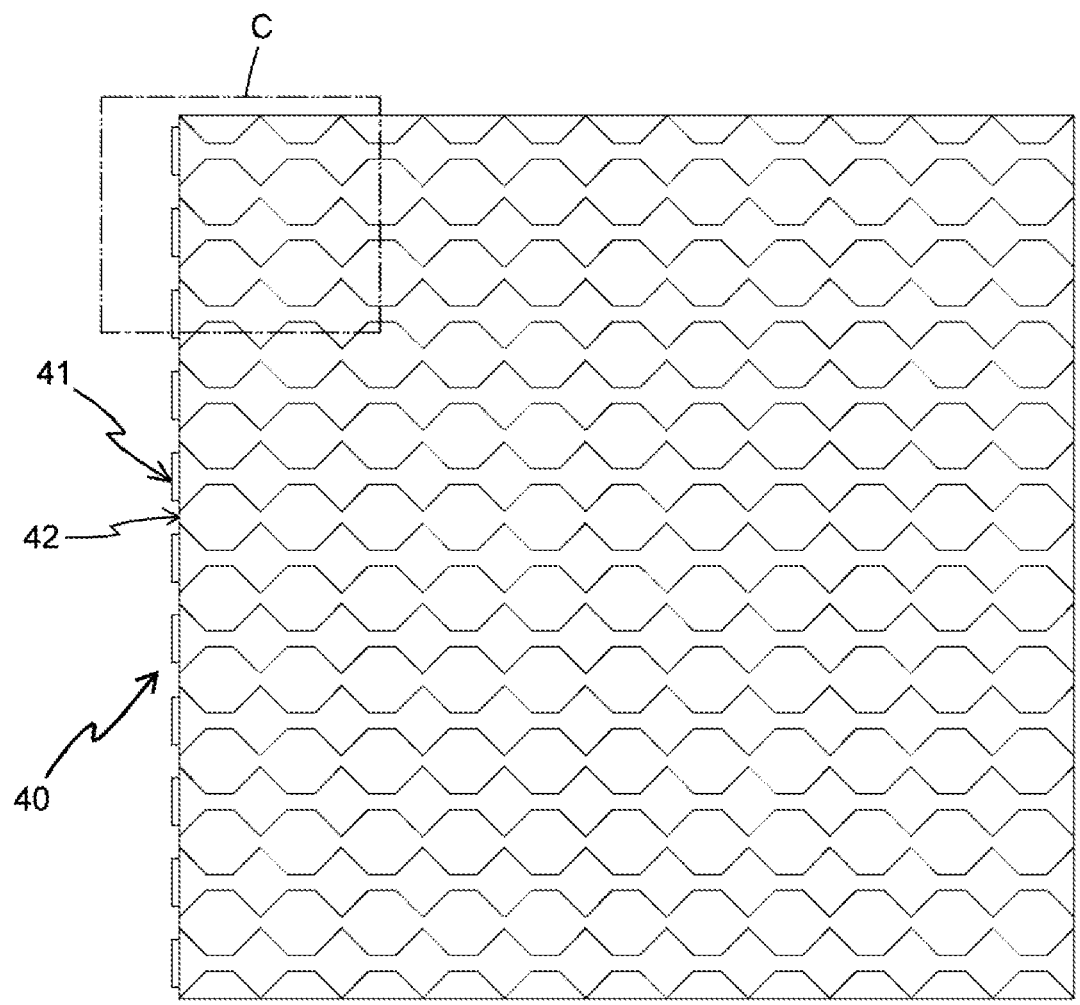
FIG. 9 is a plan view of the second sensing layer of the invention.
Figure 10:
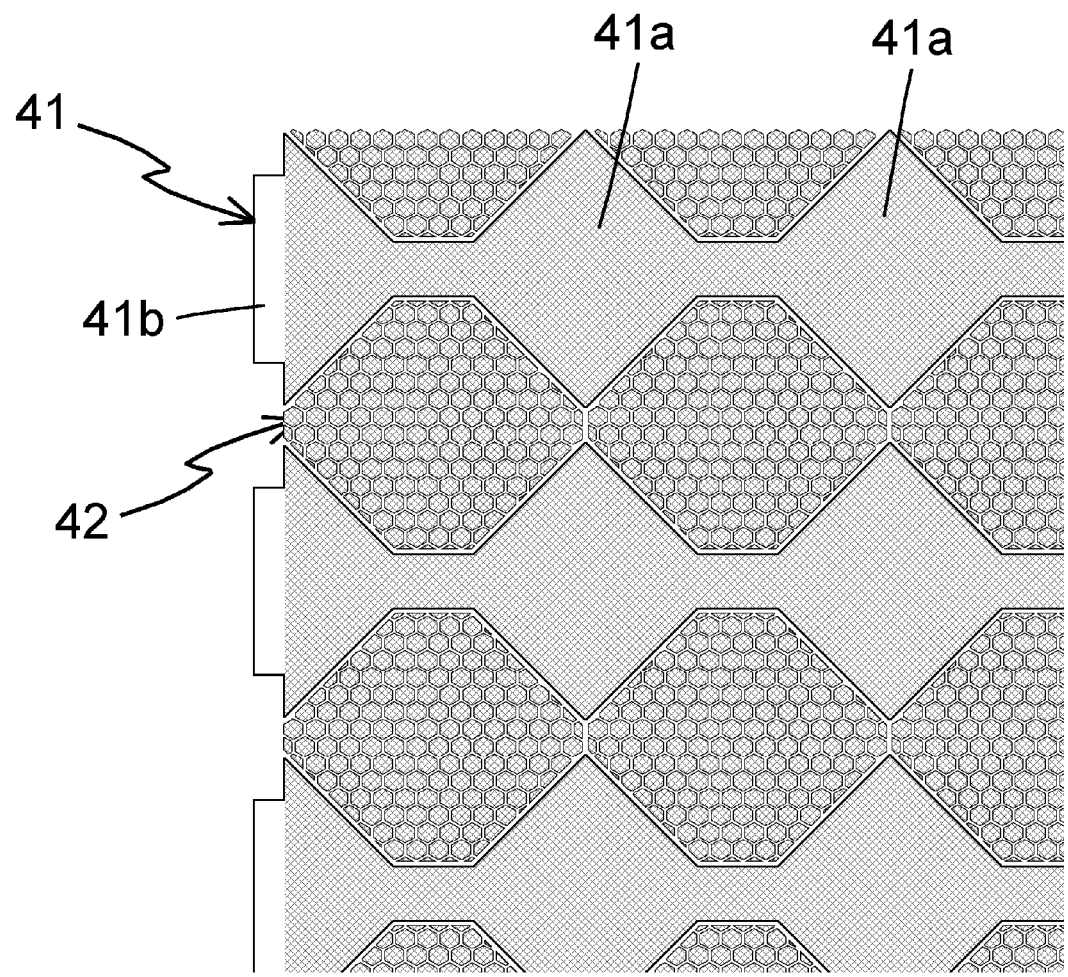
FIG. 10 is an enlarged view of part C in FIG. 8.

As shown in FIGS. 9-10, the second sensing layer 40 is substantially identical to the first sensing layer 20. The second sensing layer 40 is formed by a metal oxide conductive film TC electrically connected onto a metal mesh MM. The metal oxide conductive film TC is made of a conductive material with high transmittance, such as indium tin oxide (ITO). The metal mesh MM is composed of woven tiny metal wires. Such metal wires are woven to form a mesh sheet with high transmittance of hollowing rate of above 95%. The second sensing layer 40 is disposed on insulative layer 30 within the visible area 11a of the glass substrate 10 and has X-axis sensing columns 41 and X-axis isolation columns 42. Each X-axis isolation column 42 is sandwiched between every adjacent two of the X-axis sensing columns 41 to separate and insulate the X-axis sensing columns 41. Each X-axis sensing column 41 is composed of a string of diamond-shaped X-axis capacitive sensing units 41a connected in a column along X-axis. A left end of each of the X-axis sensing columns 41 is provided with a second contact 41b. The second contacts 41b leftward extend from the metal oxide conductive film TC of the second sensing layer 40 into the shaded area 11b of the glass substrate 10. Conductive material of each X-axis isolation column 42 is divided into disconnected insulative areas 42a. Shapes of the insulative areas 42a are arbitrary, for example, hexagon or any one or more of other geometric shapes.

The insulative layer 30 may be made of solid optically clear adhesive (OCA) or liquid optical clear resin (OCR) so as to insulate and bond the two sensing layers 20, 40. As shown in FIGS. 2 and 3, the Y-axis sensing columns 21 are orthogonal to the X-axis sensing column 41 when the two sensing layers 20, 40 have been adhesively assembled so as to make the Y-axis and X-axis sensing units 21a, 41a arranged in an interlaced and complementary manner to constitute a diamond-lattice-shaped capacitive sensing unit array.

As shown in FIGS. 1-2, the signal wire layer 50 is made of conductive material with low impedance, such as copper, aluminum or molybdenum. The signal wire layer 50 is disposed on the second sensing layer 40 within the shaded area 11a of the glass substrate 10 and has Y-axis signal transmission wires 51 and X-axis signal transmission wires 52. Each of the Y-axis signal transmission wires 51 is electrically connected to one of the first contacts 21b. An end of each of the Y-axis signal transmission wires 51 is electrically connected to a Y-axis signal output contact 51a. Each of the X-axis signal transmission wires 52 is electrically connected to one of the second contacts 41b. An end of each of the X-axis signal transmission wires 52 is electrically connected to an X-axis signal output contact 52a. The Y-axis and X-axis signal output contacts 51a, 52a may be electrically connected to a flat flexible cable (not shown) to send touch signals to a signal processor (not shown).

By dividing the conductive material of the Y-axis and X-axis isolation columns 22, 42 into disconnected small insulative areas and associating with the metal mesh, both flatness and evenness of transmittance of the two sensing layers 20, 40 can be improved to solve the problem of interference to an image shown on a display and noise capacitance can be reduced to obtain a better electric property. The sensing layers 20, 40 are formed by a metal oxide conductive film TC electrically connected onto a metal mesh, not only can the conductivity of the sensing layers 20, 40 be enhanced, but also fracture or malfunction of the sensing layers 20, 40, which causes discontinuity of signal transmission, can be prevented.

What is claimed is:

1. A capacitive touch glass structure comprising:
    a glass substrate, having a colored bezel on a periphery of a side thereof, and the colored bezel defining a shaded area and a visible area surrounded by the shaded area;
    a first sensing layer, directly superposed on the glass substrate, formed by a metal oxide conductive film electrically connected onto a metal mesh, disposed on the glass substrate, having first sensing columns along a first direction in the visible area, a first isolation column being sandwiched between every adjacent two of the first sensing columns to separate and insulate the first sensing columns, conductive material of each first isolation column being divided into disconnected insulative areas, an end of each of the first sensing columns being provided with a first contact, and the first contacts being outward extended from the metal oxide conductive film to the shaded area;
    an insulative layer superposed on the first sensing layer;
    a second sensing layer, superposed on the insulative layer to make the insulative layer sandwiched between the first sensing layer and the second sensing layer, formed by a metal oxide conductive film electrically connected onto a metal mesh, having second sensing columns along a second direction in the visible area, a second isolation column being sandwiched between every adjacent two of the second sensing columns to separate and insulate the second sensing columns, conductive material of each second isolation column being divided into disconnected insulative areas, an end of each of the second sensing columns being provided with a second contact, and the second contacts being outward extended from the metal oxide conductive film to the shaded area; and a signal wire layer, superposed on the second sensing layer to make the second sensing layer sandwiched between the signal wire layer and the insulative layer, disposed within the shaded area, having first signal transmission wires and second signal transmission wires, each of the first signal transmission wires being electrically connected to one of the first contacts, an end of each of the first signal transmission wires being electrically connected to a first signal output contact, each of the second signal transmission wires being electrically connected to one of the second contacts, and an end of each of the second signal transmission wires being electrically connected to a second signal output contact;

wherein the first direction is orthogonal to the second direction, the first sensing columns are orthogonal to the second sensing columns to constitute a capacitive sensing unit array.

2. The glass structure of claim 1, wherein the metal oxide conductive film is made of indium tin oxide, indium zinc oxide, aluminum zinc oxide, antimony tin oxide or poly(3, 4-ethylenedioxythiophene) (PEDOT).

3. The glass structure of claim 1, wherein the metal mesh is woven by metal wires made of gold, silver, copper, aluminum, molybdenum, nickel or an alloy thereof.

4. The glass structure of claim 1, wherein the signal wire layer is made of gold, silver, copper, aluminum, molybdenum, nickel or an alloy thereof or conductive silver paste.

5. The glass structure of claim 1, wherein the colored bezel is formed by an insulative film layer made of ink or photoresist.

6. The glass structure of claim 1, wherein the insulative layer is made of solid optically clear adhesive (OCA) or liquid optical clear resin (OCR).

7. The glass structure of claim 1, wherein each of the insulative areas is a hexagon, triangle, rectangle, trapezoid, strip, polygon or circle in shape.

* * * * *